US010635002B2

(12) United States Patent
Brandt et al.

(10) Patent No.: US 10,635,002 B2
(45) Date of Patent: Apr. 28, 2020

(54) FACETED EUV OPTICAL ELEMENT

(71) Applicant: ASML Netherlands B.V., Veldhoven (NL)

(72) Inventors: David C. Brandt, San Diego, CA (US); Alexander I. Ershov, San Diego, CA (US); Igor V. Fomenkov, San Diego, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 419 days.

(21) Appl. No.: 15/374,533

(22) Filed: Dec. 9, 2016

(65) Prior Publication Data

US 2017/0097572 A1 Apr. 6, 2017

Related U.S. Application Data

(62) Division of application No. 14/575,699, filed on Dec. 18, 2014, now Pat. No. 9,541,840.

(51) Int. Cl.
*G03F 7/20* (2006.01)
*G21K 1/06* (2006.01)
*H05G 2/00* (2006.01)
*G02B 5/08* (2006.01)
*G02B 5/09* (2006.01)
*G02B 19/00* (2006.01)

(52) U.S. Cl.
CPC ......... *G03F 7/7015* (2013.01); *G02B 5/0891* (2013.01); *G02B 5/09* (2013.01); *G02B 19/0019* (2013.01); *G02B 19/0095* (2013.01); *G03F 7/70033* (2013.01); *G03F 7/70175* (2013.01); *G03F 7/70916* (2013.01); *G03F 7/70933* (2013.01); *G21K 1/062* (2013.01); *H05G 2/003* (2013.01); *H05G 2/005* (2013.01); *H05G 2/008* (2013.01); *G21K 2201/067* (2013.01)

(58) Field of Classification Search
USPC ...................................... 250/504 R
See application file for complete search history.

(56) References Cited

U.S. PATENT DOCUMENTS 5,720,650 A 2/1998 Mauze et al.
2004/0022291 A1 2/2004 Das et al.
(Continued)

FOREIGN PATENT DOCUMENTS

CN 102859442 A 1/2013
JP 2010537424 A 12/2010
(Continued)

OTHER PUBLICATIONS

International Search Report of PCT/US2015/060027 dated Mar. 16, 2016.
(Continued)

*Primary Examiner* — Kiet T Nguyen
(74) *Attorney, Agent, or Firm* — Arent Fox LLP

(57) ABSTRACT

A reflective EUV optic such as a collector mirror configured as an array of facets that are spaced apart to form respective gaps between adjacent facets. The gaps are used as inlets for gas flow across one of the facets such that flow is introduced parallel to the optic surface. The facets can be made with offsets such that loss of reflective area of the EUV optic can be minimized. The gas facilitates removal of target material from the surface of the facets.

21 Claims, 9 Drawing Sheets

(56) References Cited

U.S. PATENT DOCUMENTS

| | | |
|---|---|---|
| 2006/0001854 A1 | 1/2006 | Singer et al. |
| 2008/0049291 A1 | 2/2008 | Baek et al. |
| 2009/0267005 A1 | 10/2009 | Bykanov et al. |
| 2011/0063598 A1* | 3/2011 | Fiolka ................ G03F 7/70083 355/71 |
| 2011/0140008 A1 | 6/2011 | Bergstedt et al. |
| 2014/0022658 A1 | 1/2014 | Ziegler et al. |
| 2014/0139816 A1* | 5/2014 | Hartjes ................ G02B 7/1815 355/67 |
| 2014/0176926 A1 | 6/2014 | Bowering et al. |

FOREIGN PATENT DOCUMENTS

| | | |
|---|---|---|
| JP | 2014525137 A | 9/2014 |
| TW | 201428434 A | 7/2014 |
| WO | 2014170093 A2 | 10/2014 |

OTHER PUBLICATIONS

Office Action issued in Japanese Patent Application No. 2017-527573 dated Aug. 21, 2019, pp. 1-13 (with English-Translation).
Office Action issued in TW Patent Application No. 104139225 dated Nov. 25, 2019, 19 pages (with English translation).

\* cited by examiner

FACETED EUV OPTICAL ELEMENT

CROSS-REFERENCE TO RELATED APPLICATIONS

This application is a Divisional of U.S. application Ser. No. 14/575699, filed Dec. 18, 2014, the contents of which are incorporated herein by reference into the present application.

FIELD

The present disclosure relates to an optical element useful in a system that vaporizes a target material to produce radiation in the extreme ultraviolet ("EUV") portion of the electromagnetic spectrum.

BACKGROUND

Extreme ultraviolet light, e.g., electromagnetic radiation having a wavelength of around 50 nm or less (also sometimes referred to as soft x-rays), and including light at a wavelength of about 13.5 nm, can be used in photolithography processes to produce extremely small features in substrates such as silicon wafers. Here and elsewhere herein the term "light" is used even though it is to be understood that the radiation described using that term may not be in the visible part of the spectrum.

Methods for generating EUV light include converting a target material from a liquid state into a plasma state. The target material preferably includes at least one element, e.g., xenon, lithium, tin, or some other material, with one or more emission lines in the EUV part of the spectrum. In one such method, often termed laser produced plasma ("LPP"), the required plasma is produced by using a laser beam to irradiate and so to vaporize a target material having the required line-emitting element to form a plasma in an irradiation region.

The target material may take many forms. It may be solid or a molten. If molten, it may be dispensed in several different manners such as in a continuous stream or as a stream of discrete droplets. As an example, the target material in the discussion which follows is molten tin which is dispensed as a stream of discrete droplets. It will be understood by one of ordinary skill in the art, however, that other target materials, physical phases of target materials, and delivery modes for target materials may be used.

The energetic radiation generated during de-excitation and recombination of ions in the plasma propagates from the plasma omnidirectionally. In one common arrangement, an EUV optical element in the form of a near-normal-incidence mirror (often termed a "collector mirror" or simply a "collector") is positioned to collect, direct, and, in some arrangements, focus the light to an intermediate location. The collected light may then be relayed from the intermediate location to where it is to be used, for example, to a set of scanner optics and ultimately to a wafer in the case where the EUV radiation is to be used for semiconductor photolithography.

The target material is introduced into the irradiation region by a target material dispenser. The target material dispenser is supplied with target material in a liquid or solid form. If supplied with target material in a solid form the target material dispenser melts the target material. The target material dispenser then dispenses the molten target material into the vacuum chamber containing the irradiation region.

The process of vaporizing the target material creates debris. This debris can degrade the reflectivity of the collector if the debris is allowed to reach the collector surface. In some systems $H_2$ gas at pressures in the range of 0.5 to 3 mbar is used in the vacuum chamber for debris mitigation. In the absence of gas, at vacuum pressure, it would be difficult if not impossible to protect the collector adequately from target material debris ejected from the plasma. Hydrogen is relatively transparent to EUV radiation having a wavelength of about 13.5 nm and so is preferred over other candidate gases such as He, Ar or other gases which exhibit higher absorption at a wavelength of about 13.5 nm.

$H_2$ gas is introduced into the vacuum chamber to decelerate the energetic debris (ions, atoms, and clusters) of target material created by the plasma. The debris is decelerated by collisions with the gas molecules. For this purpose a flow of $H_2$ gas counter to the debris trajectory is used. This serves to reduce the damage caused by deposition, implantation, and/or sputtering of target material on and into the optical coating of the collector. Using this method it is believed possible to decelerate energetic particles with energies of several keV down to the thermal energy of the gas by the many gas collisions at these pressures over the distance between the plasma site and the collector surface.

Another reason for introducing $H_2$ gas into the vacuum chamber is to facilitate cleaning of the collector surface. The $H_2$ gas may be dissociated into hydrogen radicals H*. The hydrogen radicals H* in turn help to remove target material deposits from the collector surface. For example, in the case of tin as the target material, the hydrogen radicals participate in reactions on the collector surface that lead to the formation of volatile gaseous stannane ($SnH_4$) which can be pumped away. For this chemical path to be efficient it is preferred that there is a low H recombination rate (the rate at which the radicals recombine to form $H_2$ molecules) on the collector surface so that the hydrogen radicals are available instead for combining with the Sn to form $SnH_4$. Generally, non-metallic compounds like nitrides, carbides, borides and oxides have a lower H recombination rate as compared to pure metals.

As mentioned, one measure for protecting the surface of the collector 30 (FIG. 2) from debris from the irradiation site 28 involves causing a flow of a gas such as molecular hydrogen across the collector surface. This gas flow deflects the debris so that the flux of debris onto the surface of the collector 30 is reduced. It is preferable that the gas flow be uniform across the collector surface so that the entire collector surface can benefit substantially equally from the protection afforded by the gas flow. In designs in which gas flow is distributed from both the center and the perimeter of the collector, it is necessary for the gas to travel more than 300mm to maintain flow across the collector surface. This requirement makes it difficult to maintain a uniform flow. Other designs, such as a "shower head" collector, deliver gas flow perpendicular to the collector surface and so do not require maintaining a uniform parallel flow, but also do not provide the benefits of a flow that is tangential or parallel to the collector surface.

There is thus a need for a gas delivery system that will introduce a flow of gas that is parallel to the surface of the collector in a manner that facilitates a uniform flow across the collector surface.

SUMMARY

The following presents a simplified summary of one or more embodiments in order to provide a basic understanding of the embodiments. This summary is not an extensive overview of all contemplated embodiments, and is not intended to identify key or critical elements of all embodiments nor delineate the scope of any or all embodiments. Its sole purpose is to present some concepts of one or more embodiments in a simplified form as a prelude to the more detailed description that is presented later.

According to one aspect of the present invention, a collector is configured as an ensemble of facets that are spaced apart to form a gap between adjacent facets. The gaps are used as inlets for gas flow across the collector surface such that flow is introduced parallel to the collector surface. The facets can be made with offsets that vary in the vertical (z axis) direction such that the reflective area loss associated with localizing of the gas distribution can be minimized.

According to another aspect of the invention there is provided a reflective EUV optic comprising a first facet comprising a first portion of a reflective surface of the reflective EUV optic and a second facet comprising a second portion of the reflective surface of the reflective EUV optic, the first facet being separated from the second facet by a gap. The first facet may be separated from the second facet in a direction parallel to an optical axis of the reflective EUV optic and the first facet may overlap the second facet in a direction substantially tangential to the reflective surface where the first facet overlaps the second facet. The reflective EUV optic may be substantially rotationally symmetric about a central optical axis, in which case the first facet and the second facet are substantially annular. The reflective EUV optic may also include a plenum in fluid communication with the gap.

According to yet another aspect of the invention there is provided a reflective EUV optic having a reflective surface, the reflective surface being comprised of a plurality of facets with adjacent facets being separated by respective gaps. At least one facet of the plurality of facets is separated from an adjacent facet in a direction parallel to an optical axis of the EUV optic and overlaps the adjacent facet in a direction substantially tangential to the reflective surface where the facet overlaps the adjacent facet. The reflective EUV optic may be substantially rotationally symmetric about a central optical axis, in which case the facets are substantially annular. The plurality of annular facets together makes up substantially the entire reflective surface. The reflective EUV optic may also include a plenum in fluid communication with the gaps.

According to yet another aspect of the invention there is provided an EUV light source comprising a reflective EUV optic including a first facet making up a first portion of a reflective surface of the reflective EUV optic and a second facet making up a second portion of the reflective surface of the reflective EUV optic, the first facet being separated from the second facet by a gap. The EUV light source also includes a gas supply in fluid communication with the gap. The first facet may be separated from the second facet in a direction parallel to an optical axis of the reflective EUV optic and the first facet may overlap the second facet in a direction substantially tangential to the reflective surface where the first facet overlaps the second facet. The reflective EUV optic may be substantially rotationally symmetric about a central optical axis, in which case the first facet and the second facet are substantially annular. The reflective EUV optic may also include a plenum in fluid communication with the gap.

According to yet another aspect of the invention there is provided an EUV light source comprising a chamber and a reflective EUV optic in the chamber. The reflective EUV optic is substantially rotationally symmetric about a central optical axis and includes a first annular facet making up a first portion of a reflective surface of the reflective EUV optic and a second annular facet making up a second portion of the reflective surface of the reflective EUV optic, the first facet being separated from the second facet by an annular inlet, the reflective EUV optic further comprising a plenum in fluid communication with the annular inlet. As used here and elsewhere in this specification, two elements are in fluid communication when they are arranged or have physical hardware connections between them so that a fluid such as a gas can flow from one to the other, either wholly unimpeded or subject to restriction. The reflective EUV optic also includes supply of gas in fluid communication with the plenum and at a pressure higher than a pressure in the chamber. The first annular facet may be separated from the second annular facet in a direction parallel to the central optical axis of the reflective EUV optic and the first annular facet may overlap the second annular facet in a direction substantially tangential to the reflective surface where the first annular facet overlaps the second annular facet to create the annular inlet. The annular inlet is configured to direct gas from the supply in a direction tangential to the reflective surface where the first annular facet overlaps the second annular facet.

According to yet another aspect of the invention there is provided an EUV light source including a chamber and a reflective EUV optic in the chamber, the reflective EUV optic being substantially rotationally symmetric about a central optical axis and comprising a plurality of annular facets comprising respective portions of a reflective surface of the reflective EUV optic, the plurality of annular facets together making up substantially the entire reflective surface, each of the annular facets being spaced away from adjacent annular facets by a respective one of a plurality of annular inlets in a direction parallel to the central optical axis of the reflective EUV optic, a supply of gas in fluid communication with the plurality of annular inlets and at a pressure higher than the pressure in the chamber so that gas flows from the supply and into the chamber through the annular inlets, each of annular facets overlapping at least one adjacent annular facet in a direction substantially tangential to the reflective surface where the annular facet overlaps the adjacent annular facet to create one of the plurality of annular inlets, the plurality of annular inlets thus being configured to direct the gas from the supply in a direction tangential to the reflective surface where the annular facets overlap.

According to yet another aspect of the invention there is provided a method of generating EUV light, the method comprising the steps of providing a reflective EUV optic having a first facet comprising a first portion of a reflective surface of the reflective EUV optic and a second facet comprising a second portion of the reflective surface of the reflective EUV optic, the first facet being separated from the second facet by a gap and flowing gas from a gas supply through the gap tangentially past the second portion of the reflective surface of the reflective EUV optic.

According to yet another aspect of the invention there is provided a method of creating a gas sheath for a reflective EUV optic, the EUV optic being substantially rotationally symmetric about a central optical axis, comprising the steps of providing the EUV optic with a plurality substantially circular inlets centered on the optical axis and directed to cause gas flowing out of the inlets to flow across a reflective surface of the EUV optic and supplying gas to the plurality substantially circular inlets.

According to yet another aspect of the invention there is provided a method of constructing a reflective EUV optic comprising the steps of providing a support, providing a plurality of substantially circular ring-shaped reflective elements each having an interior diameter different from the interior diameter of other ring-shaped reflective elements and an exterior diameter different from the exterior diameter of other ring-shaped reflective elements; and mounting the plurality of substantially circular ring-shaped reflective elements on the support in a bull's-eye arrangement so that the plurality of substantially circular ring-shaped reflective elements have a common center and a common focal point and so that for any two adjacent circular ring-shaped reflective elements the exterior diameter of the circular ring-shaped reflective element mounted closer to the optical axis is greater than the interior diameter of the circular ring-shaped reflective element mounted farther from the optical axis and the exterior edge of the circular ring-shaped reflective element mounted closer to the optical axis overlaps in the direction of the optical axis the interior edge of the circular ring-shaped reflective element mounted farther from the optical axis to create a gap between the exterior edge of the circular ring-shaped reflective element mounted closer to the optical axis and the interior edge of the circular ring-shaped reflective element mounted farther from the optical axis through which gas may flow.

According to yet another aspect of the invention there is provided an EUV optical system comprising a first reflective optical element comprised of a plurality of reflective facets, the facets of the first optical element being configured and arranged and of a sufficient number such that the first optical element functions as a collector mirror in the EUV optical system and as a field facet mirror in the EUV optical system.

DETAILED DESCRIPTION

Figure 1:
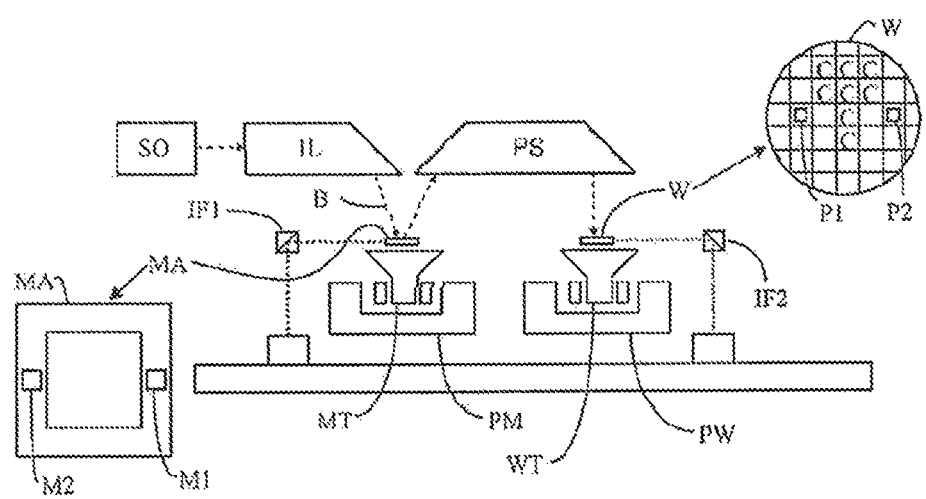
FIG. 1 shows a schematic, not to scale, view of an overall broad conception for a laser-produced plasma EUV light source system according to an aspect of the present invention.

Various embodiments are now described with reference to the drawings, wherein like reference numerals are used to refer to like elements throughout. In the following description, for purposes of explanation, numerous specific details are set forth in order to promote a thorough understanding of one or more embodiments. It may be evident in some or all instances, however, that any embodiment described below can be practiced without adopting the specific design details described below. In other instances, well-known structures and devices are shown in block diagram form in order to facilitate description of one or more embodiments. The following presents a simplified summary of one or more embodiments in order to provide a basic understanding of the embodiments. This summary is not an extensive overview of all contemplated embodiments, and is not intended to identify key or critical elements of all embodiments nor delineate the scope of any or all embodiments.

FIG. 1 schematically depicts a lithographic apparatus according to an embodiment of the invention. The apparatus comprises an illumination system IL configured to condition a radiation beam B of radiation. The apparatus also includes a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive or reflective projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device in a manner that depends on the orientation of the patterning device, the design of the lithographic apparatus, and other conditions, such as, for example, whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system.

Referring to FIG. 1, the illumination system IL receives a radiation beam from a radiation source SO. The source SO and the illumination system IL, together with the beam delivery system if required, may be referred to as a radiation system.

The illumination system IL may comprise an adjuster for adjusting the angular intensity distribution of the radiation beam. Generally, at least the outer and/or inner radial extent of the intensity distribution in a pupil plane of the illumination system can be adjusted. In addition, the illumination system IL may comprise various other components, such as an integrator and a condenser. The illumination system may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device MA with respect to the path of the radiation beam B, e.g. after mechanical retrieval from a mask library, or during a scan.

Figure 2:
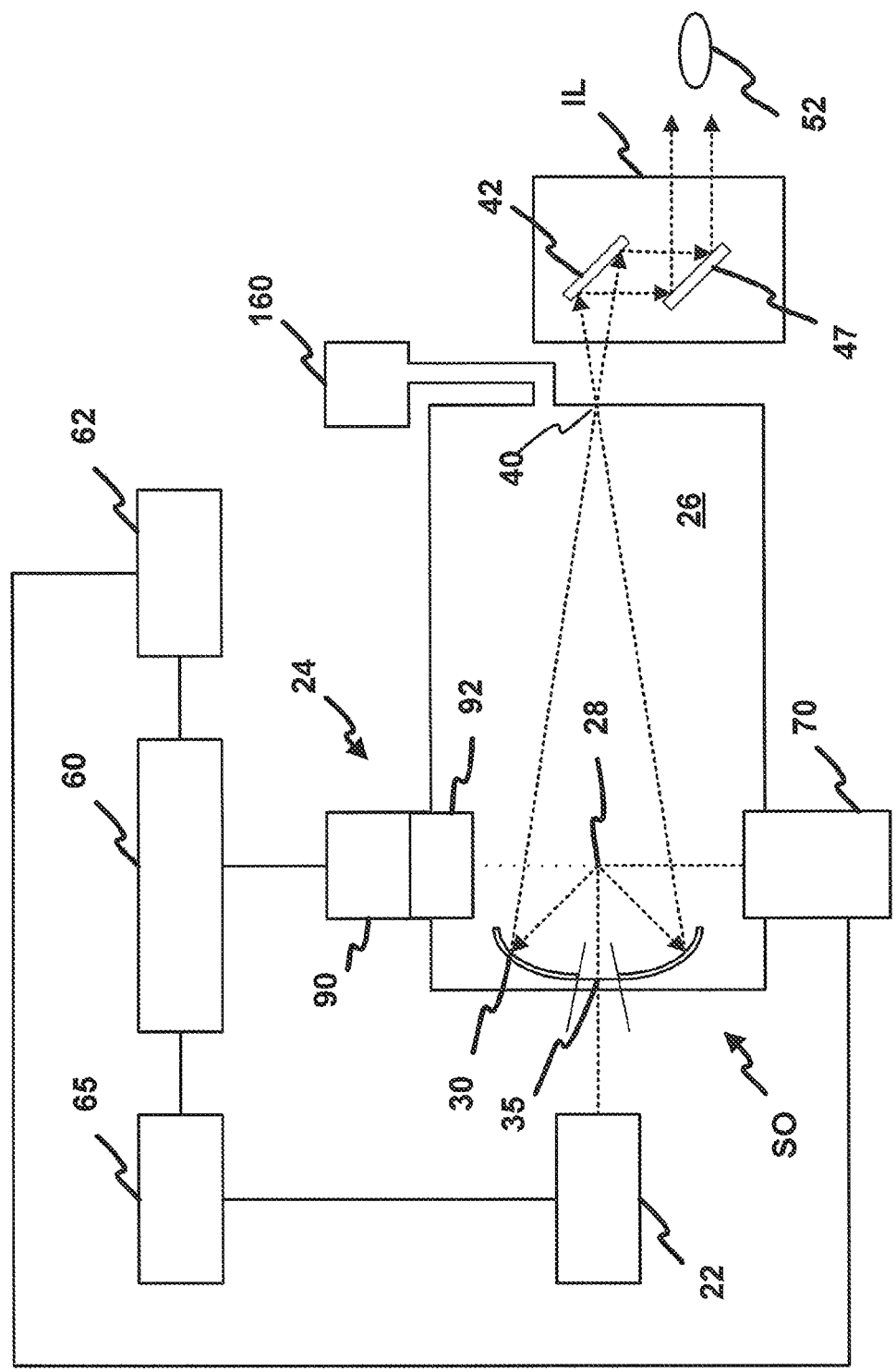
FIG. 2 is a functional block diagram of a light source for the system of FIG. 1.

FIG. 2 shows an embodiment of a source SO such as could be used in the apparatus of FIG. 1 in more detail. The source SO generates EUV radiation from a plasma which is formed at a plasma formation site or irradiation region 28. The plasma is created by directing a laser beam onto a suitable target material such as Sn, In, Gd, or some other material that is introduced into the chamber 26 by target material dispenser 24. The laser beam causes the target material to be vaporized, thereby generating the plasma. As mentioned, a source of this type may be referred to as a laser produced plasma or LPP source. The LPP light source SO may include a system 22 for generating a train of light pulses and delivering the light pulses into a chamber 26. As detailed below, each light pulse may travel along a beam path from the system 22 and into the chamber 26 to illuminate a respective target droplet at an irradiation region 28. It should be noted that as used herein an irradiation region is a region for target material irradiation to occur, and is an irradiation region even at times when no irradiation is actually occurring. In the example which follows, the example of a target material dispenser 24 that dispenses target material in the form of droplets of target material will be used. It will be appreciated, however, that the target material dispenser 24 can also dispense target material in other forms, including a continuous stream of target material.

Suitable lasers for use in the system SO shown in FIG. 2 may include a pulsed laser device, e.g., a pulsed gas discharge $CO_2$ laser device producing radiation at 9.3 μm or 10.6 μm, e.g., with DC or RF excitation, operating at relatively high power, e.g., 10 kW or higher and high pulse repetition rate, e.g., 50 kHz or more. In one particular implementation, the laser may be an axial-flow RF-pumped $CO_2$ laser having an oscillator-amplifier configuration (e.g. master oscillator/power amplifier (MOPA) or power oscillator/power amplifier (POPA)) with multiple stages of amplification and having a seed pulse that is initiated by a Q-switched oscillator with relatively low energy and high repetition rate, e.g., capable of 100 kHz operation. From the oscillator, the laser pulse may then be amplified, shaped and/or focused before reaching the irradiation region 28. Continuously pumped $CO_2$ amplifiers may be used for the system SO. For example, a suitable $CO_2$ laser device having an oscillator and three amplifiers (O-PA1-PA2-PA3 configuration) is disclosed in U.S. Pat. No. 7,439,530, issued on Oct. 21, 2008, the entire contents of which are hereby incorporated by reference herein. Alternatively, the laser may be configured as a so-called "self-targeting" laser system in which the droplet serves as one mirror of the optical cavity. In some "self-targeting" arrangements, an oscillator may not be required. Self-targeting laser systems are disclosed and claimed in U.S. Pat. No. 7,491,954, issued on Feb. 17, 2009, the entire contents of which are hereby incorporated by reference herein.

Depending on the application, other types of lasers may also be suitable, e.g., an excimer or molecular fluorine laser operating at high power and high pulse repetition rate. Other examples include, a solid state laser, e.g., having a fiber, rod, slab or disk-shaped active media, other laser architectures having one or more chambers, e.g., an oscillator chamber and one or more amplifying chambers (with the amplifying chambers in parallel or in series), a master oscillator/power oscillator (MOPO) arrangement, a master oscillator/power ring amplifier (MOPRA) arrangement, or a solid state laser that seeds one or more excimer, molecular fluorine or $CO_2$ amplifier or oscillator chambers, may be suitable. Other designs may also be suitable.

As further shown in FIG. 2, the target material dispenser 24 delivers target material into the interior of the chamber 26 to the irradiation region or plasma site 28, where the target material will interact with one or more light pulses, e.g., zero, one or more pre-pulses and thereafter one or more main pulses, to ultimately produce a plasma and generate an EUV emission. The EUV emitting element, e.g., tin, lithium, xenon, etc., may be in the form of liquid droplets and/or solid particles contained within liquid droplets. For example, the element tin may be used as pure tin, as a tin compound, e.g., $SnBr_4$, $SnBr_2$, $SnH_4$, as a tin alloy, e.g., tin-gallium alloys, tin-indium alloys, tin-indium-gallium alloys, or a combination thereof. Depending on the material used, the target material may be presented to the irradiation region 28 at various temperatures including room temperature or near room temperature (e.g., tin alloys, $SnBr_4$), at an elevated temperature, (e.g., pure tin) or at temperatures below room temperature, (e.g., $SnH_4$), and in some cases, can be relatively volatile, e.g., $SnBr_4$. More details concerning the use of these materials in an LPP EUV light source is provided in U.S. Pat. No. 7,465,946, issued on Dec. 16, 2008, the entire contents of which are hereby incorporated by reference herein. In some cases, an electrical charge is placed on the target material to permit the target material to be steered toward or away from the irradiation region 28.

Continuing with FIG. 2, the light source SO may also include one or more EUV optical elements such as EUV optic 30. The EUV optic 30 may be a collector mirror in the form of a normal incidence reflector, for example, implemented as a multilayer mirror (MLM), that is, a SiC substrate coated with a Mo/Si multilayer with additional thin barrier layers deposited at each interface to effectively block thermally-induced interlayer diffusion. Other substrate materials, such as Al or Si, can also be used. The EUV optic 30 may be in the form of a prolate ellipsoid, with an aperture 35 to allow the laser light to pass through and reach the irradiation region 28. The EUV optic 30 may be, e.g., in the shape of a ellipsoid that has a first focus at the irradiation region 28 and a second focus at a so-called intermediate point 40 (also called the intermediate focus 40) where the EUV light may be output from the EUV light source SO and input to, e.g., an integrated circuit lithography tool as described above.

The EUV light source 20 may also include an EUV light source controller system 60, which may also include a laser firing control system 65, along with, e.g., a laser beam positioning system (not shown). The EUV light source 20 may also include a target position detection system which may include one or more droplet imagers 70 that generate an output indicative of the absolute or relative position of a target droplet, e.g., relative to the irradiation region 28, and provide this output to a target position detection feedback system 62. The target position detection feedback system 62 may use this output to compute a target position and trajectory, from which a target error can be computed. The target error can be computed on a droplet-by-droplet basis, or on average, or on some other basis. The target error may then be provided as an input to the light source controller 60. In response, the light source controller 60 can generate a control signal such as a laser position, direction, or timing correction signal and provide this control signal to a laser beam positioning controller (not shown). The laser beam positioning system can use the control signal to control the laser timing circuit and/or to control a laser beam position and shaping system (not shown), e.g., to change the location and/or focal power of the laser beam focal spot within the chamber 26.

As shown in FIG. 2, the target material dispenser 24 may include a target delivery control system 90. The target delivery control system 90 is operable in response to a signal, for example, the target error described above, or some quantity derived from the target error provided by the system controller 60, to correct for errors in positions of the target droplets within the irradiation region 28. This may be accomplished, for example, by repositioning the point at which a target delivery mechanism 92 releases the target droplets. The target delivery mechanism 92 extends into the chamber 26 and is also externally supplied with target material and gas to place the target material in the target delivery mechanism 92 under pressure. FIG. 2 also shows a gas outlet 160 through which gas which enters the chamber 26 is exhausted.

As shown, the light from the source SO passes through an intermediate focus 40 and enters the illumination system IL. Of course, the intermediate focus 40 can be in the source SO, in the illumination system IL, or optically interposed between them, that is, light leaving the source SO passes through the intermediate focus before entering the illumination system IL. Illumination system IL may include a field facet mirror 42 and a pupil facet mirror 47. The field facer mirror 42 and a pupil facet mirror 47 may be configured as faceted mirrors. For example, these mirrors may have about 400 thin rectangular shaped mirror segments (facets). In the course of manufacturing these mirrors, these facets may be polished and shaped individually.

Figure 3A:
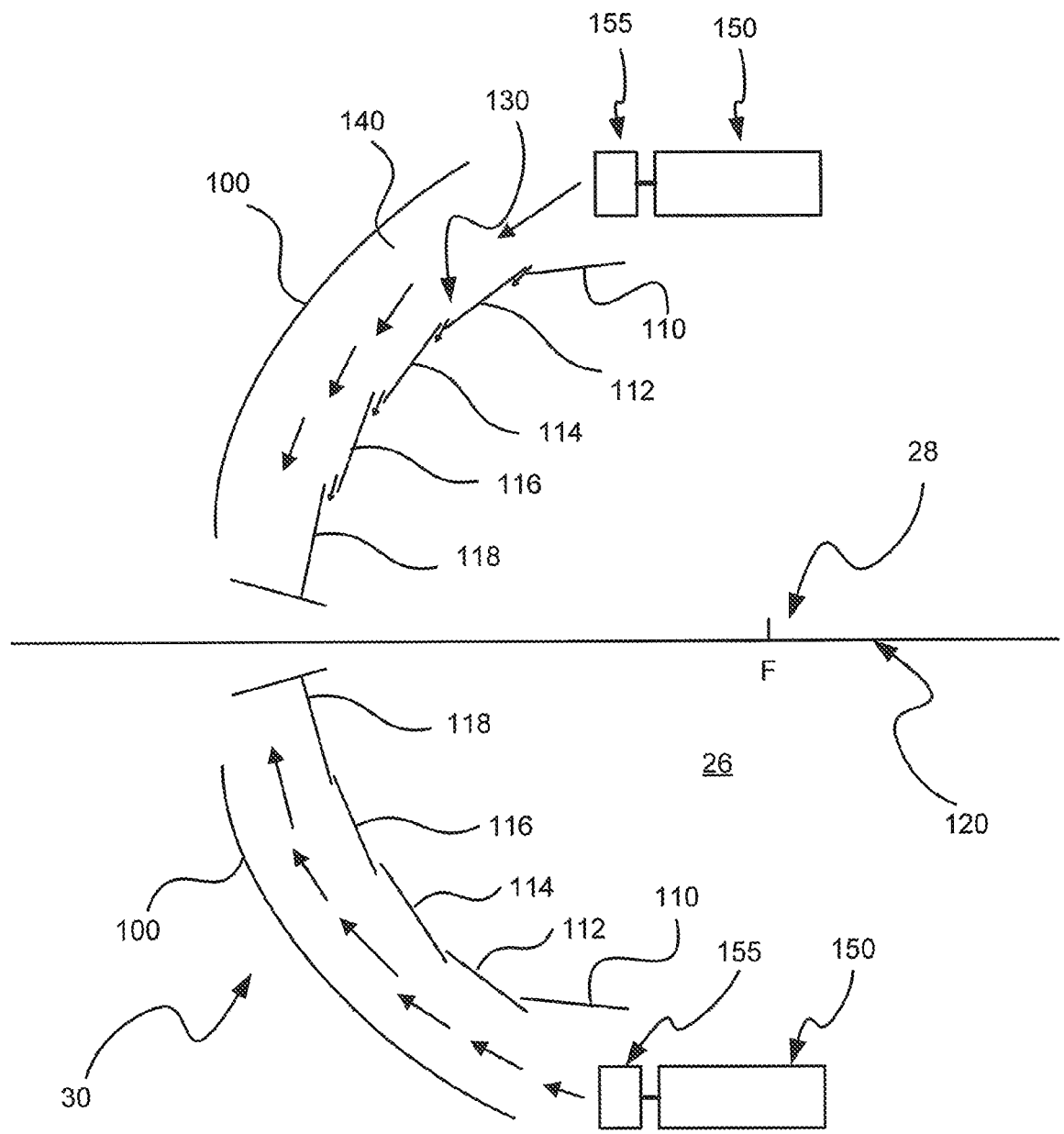
FIGS. 3a and 3b are respective schematic cutaway side views of a faceted EUV optic according to a first and second aspect of the present invention.

FIG. 3a shows one version of the collector 30 in greater detail. The collector 30 includes a support 100 to which are mounted an ensemble of concentric facet elements 110, 112, 114, 116, and 118. The embodiment of FIG. 3a shows five facet elements but one of ordinary skill in the art will readily appreciate that other numbers of facet elements can be used. In the embodiment of FIG. 3a the facet elements are annular with the center of the annulus or ring of each facet element on an optical axis 120 of the collector mirror 30. Also, the facet elements are arranged such that they have a common focus F which corresponds to the irradiation region 28.

FIG. 3a shows an embodiment in which the facet elements are flat but one of ordinary skill in the art will readily appreciate that the facet elements may also be curved. The front surfaces of the facet elements, that is, the surface facing the focus F, are provided with a multilayered reflective coating in a manner known in the art.

The facet elements are arranged so that they are offset from one another in the direction of the optical axis 120. The facet elements are also arranged so that they overlap one another in a direction tangential to their surfaces where they overlap. In this way, light generated at the focus F always strikes a reflective surface so that there is no loss of reflectivity in the facet arrangement.

This arrangement of the facet elements creates gaps between the facet elements, one of the gaps being labeled as gap 130. As can be seen, the gap 130 and the other gaps form passageways or inlets. The arrangement of FIG. 3a also includes a plenum 140 which is in fluid communication with the gaps. The configuration of FIG. 3a also includes a gas supply 150 which is in fluid communication with the plenum 140. Here and in the claims when two elements are said to be "in fluid communication" it means that a fluid such as a gas can flow directly or indirectly between them.

The gas supply 150 supplies gas under pressure to the plenum 130. In a presently preferred embodiment the gas is molecular hydrogen $H_2$. The purpose of the gas supply is to set up a flow of gas through the plenum 140 and out of the gaps. As the collector 30 is normally disposed within the chamber 26 the pressure of the gas from the gas supply 150 is maintained above the pressure in the chamber 26. The gas flowing through the gaps is directed by the geometry of the gaps in a direction parallel or tangential to the surface of the facet adjacent to the gap. In this way, the overall gas flow creates a sheet or sheath of gas flowing parallel or tangential to the surface of the collector 30. This gas sheath protects the reflective surface of the collector 30 from debris, including ions, generated at the irradiation site 28, as described above. In addition, the can be a gas flow controller 155 between the gas supply 150 and the plenum 140 to accurately control the amount of gas.

The arrangement shown in FIG. 3a also includes a gas exhaust 160 (shown in FIG. 2) to withdraw gas from the plenum 140 and so promote a uniform flow of gas through the plenum 140.

Figure 3B:
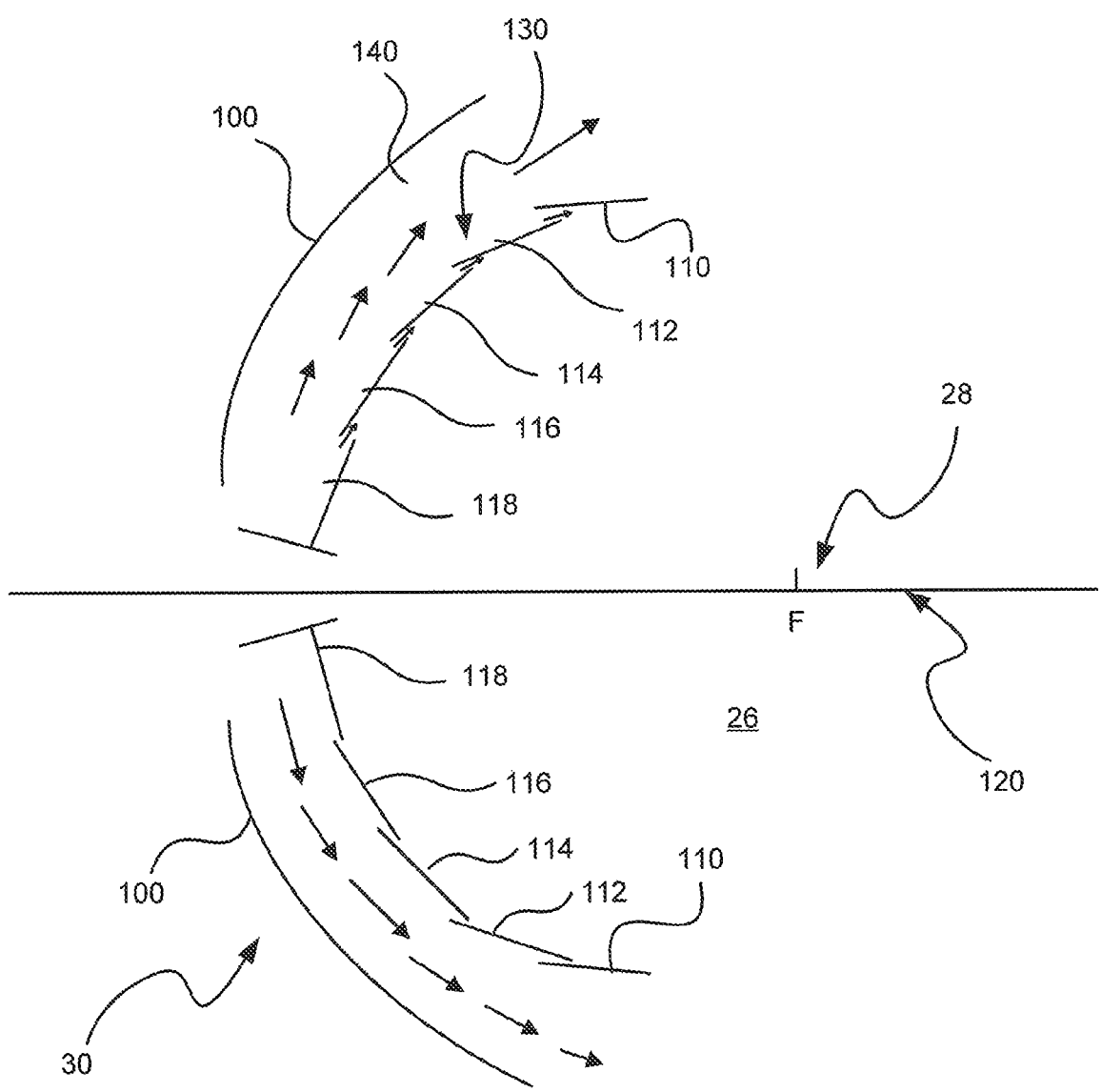

The arrangement of FIG. 3a may be referred to as an "outer over inner" arrangement in which a facet overlaps the adjacent facet that is closer to the center. This results in a gas flow from the circumference towards the center as shown in FIG. 3a. It is also possible to have an "inner over outer" arrangement in which a facet overlaps the adjacent facet that is farther from the center. Such an arrangement is shown in FIG. 3b. This results in a gas flow from the circumference towards the center as shown in FIG. 3b.

Figure 4A:
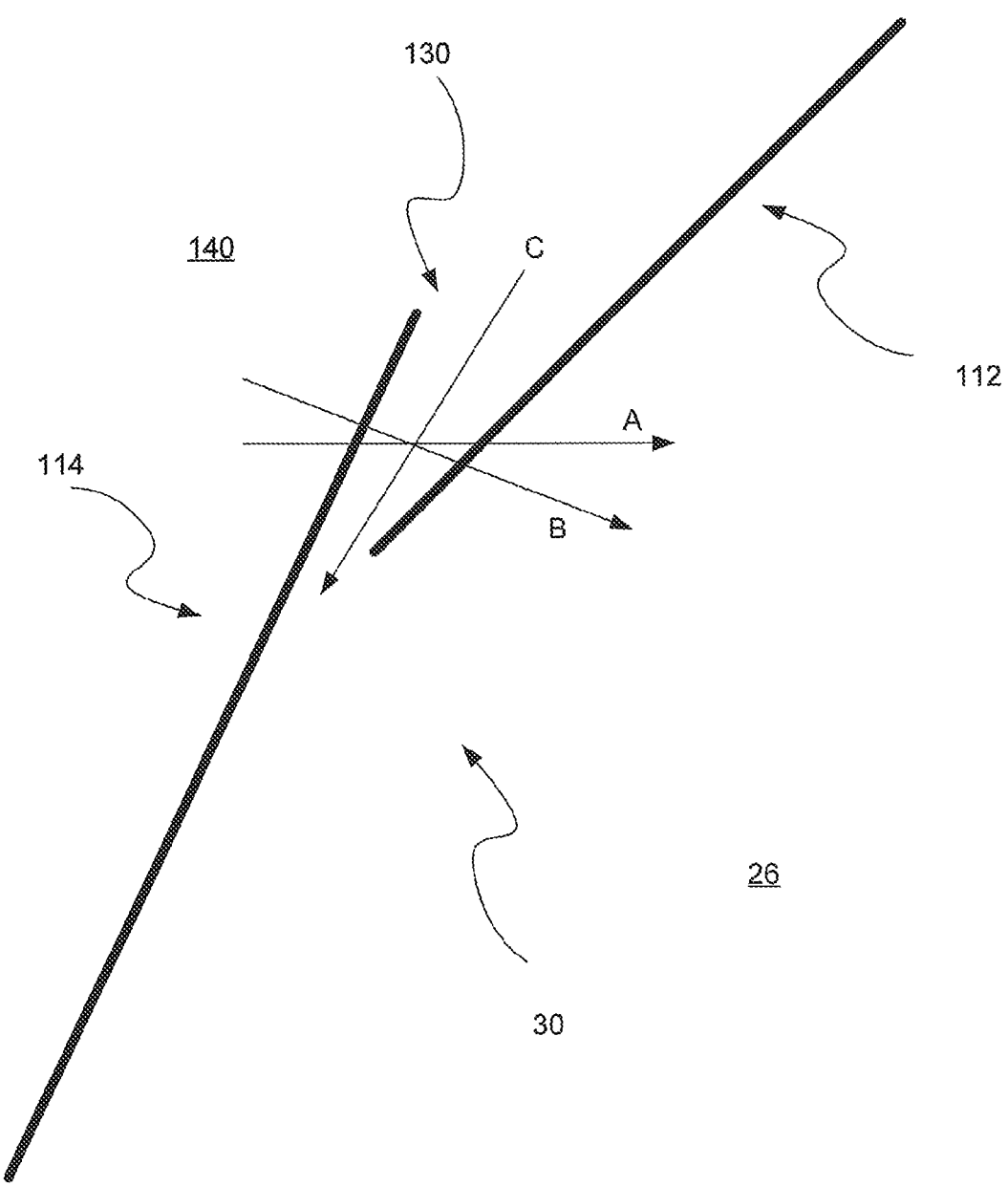
FIGS. 4a and 4b are enlarged views of part of the faceted EUV optic of FIG. 3a and FIG. 3b, respectively.
Figure 4B:
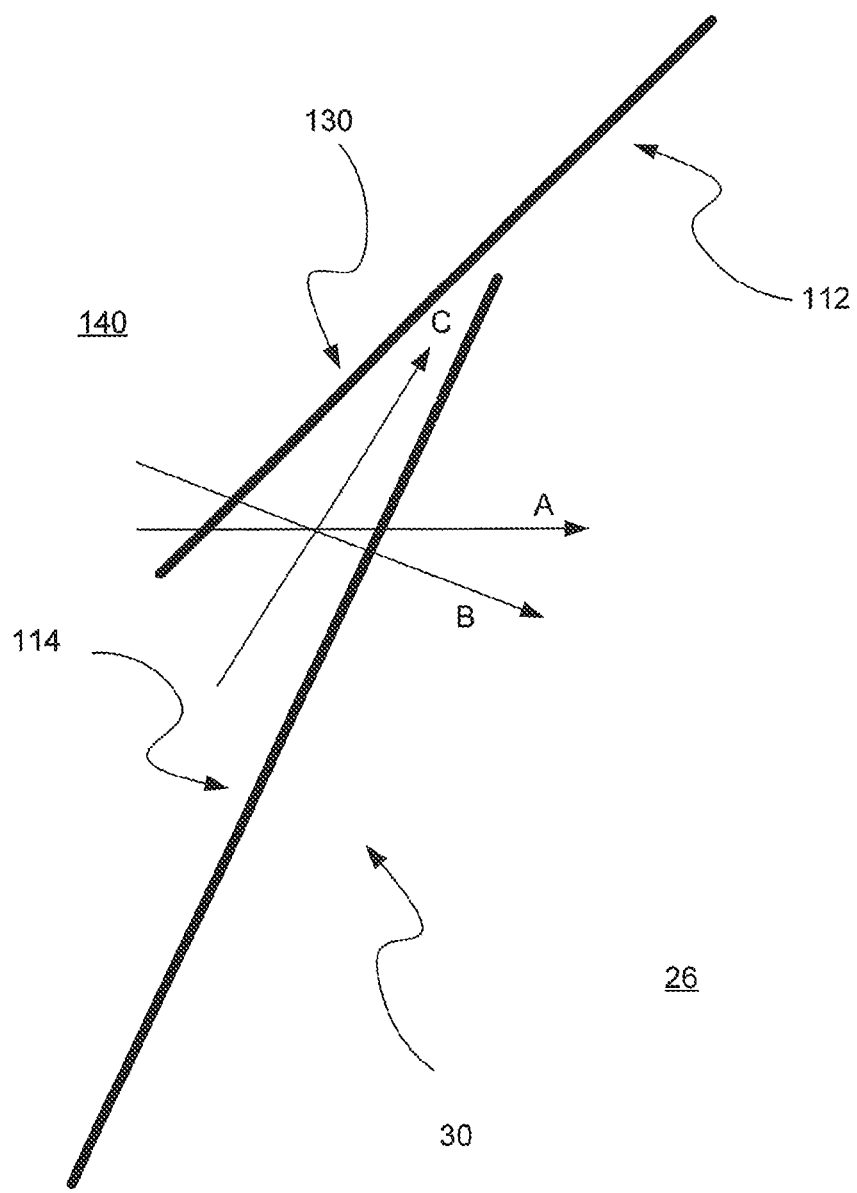

FIG. 4a is a close up view of the gap 130 in the collector 30 of FIG. 3a. As can be seen, the gap 130 is created by an offset between the adjacent facets 112 and 114 in a direction parallel to the optical axis of the collector 30 labeled by arrow A. "In a direction parallel to the optical axis" includes both (1) oriented parallel to and in the same direction as the optical axis and (2) oriented parallel to and in an opposite direction to the optical axis. It will be understood that only a portion of the facets 112 and 114 are shown in FIG. 4. The offset between the facets 112 and 114 can also be conceived of as being parallel to a direction towards the focus F of the collector 30 (and thus also towards the irradiation region 28) in the direction indicated by arrow B. The facets 112 and 114 set up a gas barrier between the plenum 140 and the interior of the chamber 26. Gas introduced into the plenum 140 at a pressure higher than that inside the chamber 26 thus flows through the gap 130 in the direction indicated by the arrow C which is substantially tangential to the surface of the facet 114. The same is true of the other gaps created by the offsets between the other facets. FIG. 4b is a close up view of the gap 130 in the collector 30 of FIG. 3b. As will be readily understood, all of the same considerations apply, except that the "inner over outer" geometry of the gap causes the gas to leave the gap in a direction away from the center of the collector 30.

Figure 5A:
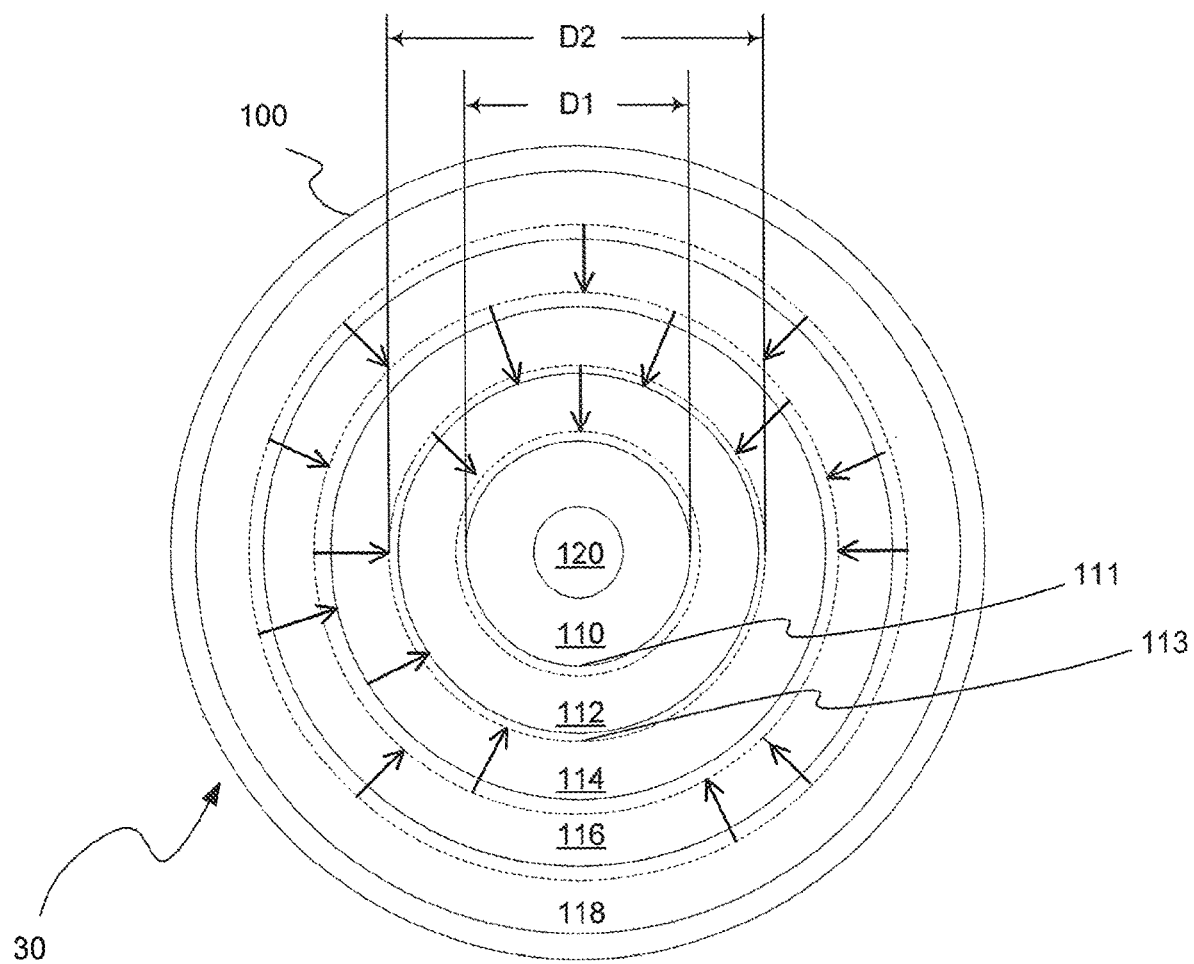
FIGS. 5a and 5b are plan views of a faceted EUV optic that could serve as the faceted optic of FIG. 3a and FIG. 3b, respectively.

FIG. 5a is a plan view of a faceted mirror that could serve as the collector 30 of FIG. 3a. As shown, each of the facet elements is arranged concentrically about the optical axis 120 of the collector 30. Also, each facet element overlaps with at least one adjacent facet element. Taking as a particular example facet element 112, it is ring shaped in plan view. It has an inner edge 111 and an outer edge 113. The outer edge is shown in phantom because it is obscured by the inner edge of facet element 114. The facet element 112 has an inner diameter designated as D1 taken as the width of the inner edge 111, that is, the width of the hole in the middle of the ring that makes up facet element 112, and an outer diameter designated as D2 taken as the width of the outer edge 113 of facet element 112. The inner diameter D1 of the facet element 112 is smaller than the outer diameter of the adjacent facet element 110. Also, the outer diameter D2 of the facet element 112 is larger than the inner diameter of adjacent facet element 114. As can be discerned from FIG. 5a the outer diameters of the facet elements get progressively larger with the distance of the facet element from the optical axis 120. The same is true for the inner diameters.

Figure 5B:
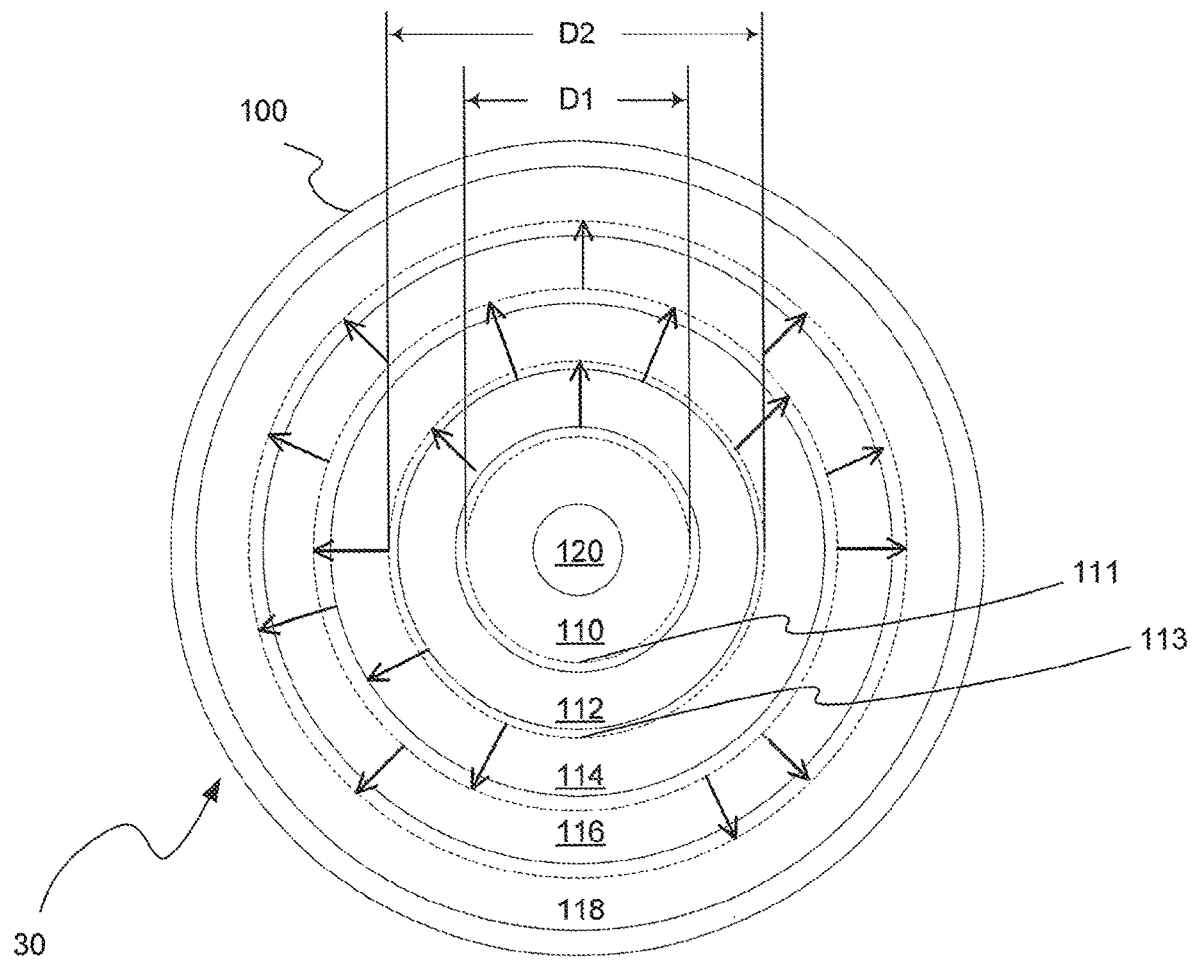

The above describes a pattern of overlap of adjacent facet elements in which outer elements overlap inner elements. It will be apparent to one for having ordinary skill in the art that the pattern of overlap of adjacent facet elements can be different from this. For example, inner elements could overlap outer elements. This is shown in FIG. 5b. It is preferred, however, that whatever overlap pattern is used there is no break in the reflective surface presented by the ensemble of facet elements from the perspective of light originating from the irradiation region 28, in other words, that the gaps be obscured by the overlap from this perspective.

As mentioned above, the EUV optic 30 can be made up of a range of numbers of facets. Is presently preferred that there be at least two facets so that there is at least one gap. The number of facets can theoretically range up to any number with the limitation that increasing the number of facets increases the complexity of constructing the EUV optic 30. For example, as mentioned, the field facet mirror can be made up of 400 facets. Another limitation on the number of facets is that even with the measures mentioned above there is a loss of reflectivity that increases with the number of facets because even when the facets are overlapped there is a shadow effect on the incoming or reflected light ray.

It should also be noted that the facets are not all necessarily the same shape and do not necessarily all have the same radial width.

One potential advantage of using a faceted mirror for the collector 30 is that as the number of facets of the faceted mirror increases and starts to approach the number of facets that would be used for the field facet mirror 42, e.g., about 400 facets, the faceted mirror serving as the collector 30 can be configured to perform the optical functions of both the collector mirror 30 and the field facet mirror 42, thus eliminating the need for a separate field facet mirror 42. This is potentially a significant advantage because each reflection off a mirror can reduce the amount of light by 30%, so that eliminating a mirror can decrease the overall loss of light by the same amount. As used here, what is meant by saying that the faceted mirror can be configured is that the individual facets of the mirror can be shaped, sized, and oriented so that the mirror when used as the collector 30 can additionally perform the function of, and eliminate the need for, a separate field facet mirror 42.

Each facet comprises a substrate on which is placed a multiple layer reflective surface. The multiple layer reflective surface is optimized to reflect light at the wavelengths of interest, about 13.5 nm. The facet may also include a smoothing layer between the substrate and the multiple layer reflective surface and a capping layer on top of the multiple layer reflective surface in a manner known in the art.

The gaps between the facets are shaped so that gas leaving the gap is directed to flow uniformly over the surface of the adjacent facet. The gas may include diatomic hydrogen $H_2$, which may become dissociated the hydrogen radicals $H^*$. The gas may also include hydrogen radicals $H^*$ themselves. The hydrogen radicals $H^*$ then react with the target material, here tin, on the collector surface to form $SnH_4$ (stannane). The gaps are preferably arranged and distributed so that there is a supply of fresh gas close to the front surface of each facet. The gaps are also preferably arranged and distributed so that every region is substantially the same distance away from an gas inlet defined by a gap.

The amount of overlap between adjacent facets is selected so that the gap between the facets is obscured from the perspective of the irradiation region 28. The amount of overlap is also selected to provide sufficient lateral extent for the gap so the gap effectively directs gas tangentially to the surface of the adjacent facet. It will also be understood by one of ordinary skill in the art that the amount of overlap can vary from location to location, that is, the overlaps are not necessarily all the same in extent.

Figure 6:
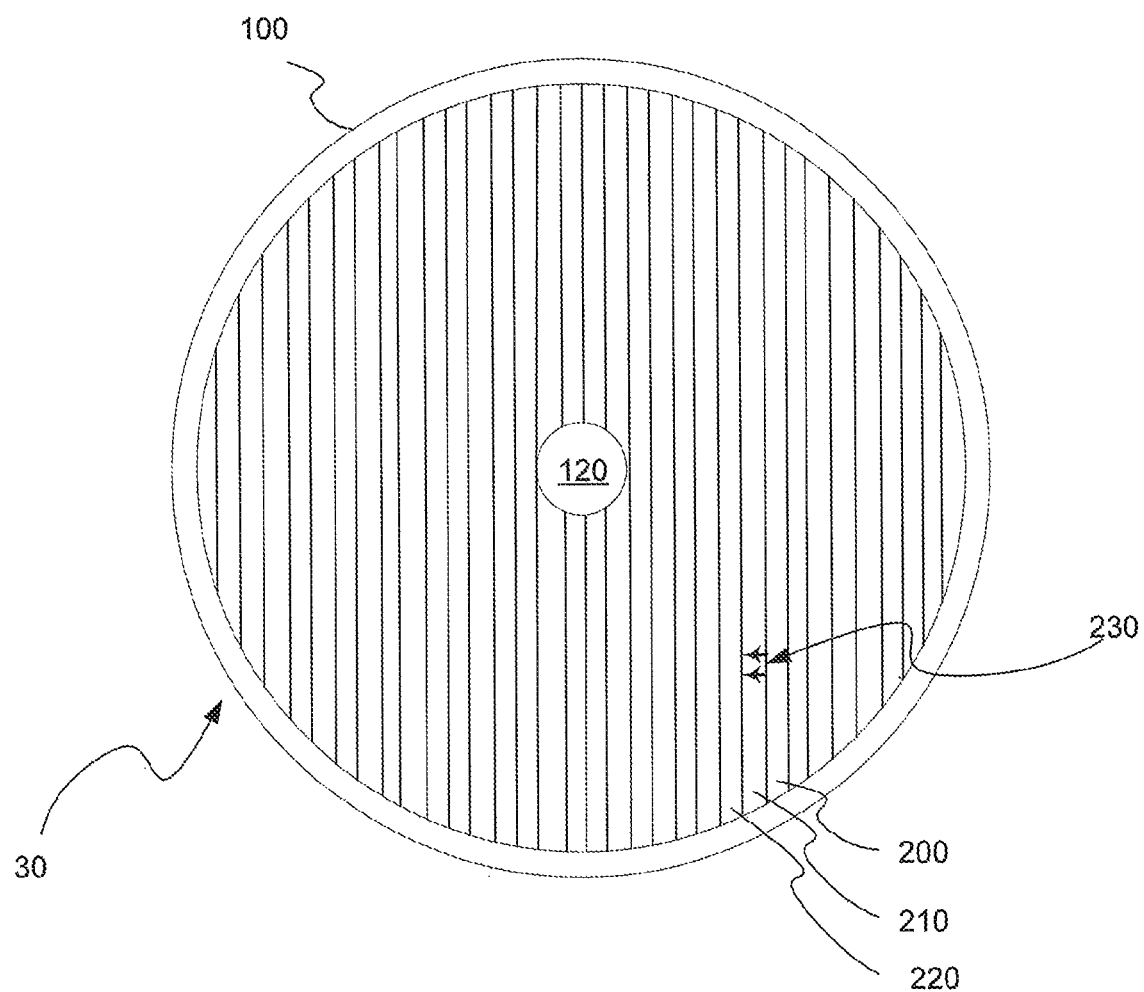
FIG. 6 is a plan view of an additional embodiment of a faceted EUV optic.

FIG. 6 shows a collector mirror 30 configured as an array of parallel strips as another example of a facet geometry that could be used. Specifically shown in FIG. 6 is a mirror having a first strip-shaped facet 200 adjacent a second strip-shaped facet 210 which is in turn adjacent a third strip-shaped facet 220. In the example shown the first strip-shaped facet 200 overlaps and is spaced away from the second strip-shaped facet 210 in a direction perpendicular to the plane of the figure to create a gap between them through which gas may flow across the surface of the strip-shaped facet 210 as indicated by the arrows 230.

The geometrical considerations of FIG. 4a apply to the configuration of FIG. 6. The gaps are created by respective offsets between adjacent facets, but in a direction perpendicular to the lateral edges of the facets. Also, each facet element overlaps with at least one adjacent facet element. It will be apparent to one having ordinary skill in the art that the pattern of overlap of adjacent facet elements can be different from this. For example, inner elements could overlap outer elements or an alternating overlap pattern could be used. It is preferred, however, that whatever overlap pattern is used there is no break in the reflective surface presented by the ensemble of facet elements from the perspective of light originating from the irradiation region 28, in other words, that the gaps be obscured by the overlap from this perspective.

As mentioned above, the EUV optic 30 can be made up of a range of numbers of facets. Is presently preferred that there be at least two facets so that there is at least one gap. The number of facets can theoretically range up to any number with the limitation that increasing the number of facets increases the complexity of constructing the EUV optic 30. For example, as mentioned, the field facet mirror can be made up of 400 facets. Another limitation on the number of facets is that even with the measures mentioned above there is a loss of reflectivity that increases with the number of facets because even when the facets are overlapped there is a shadow effect on the incoming or reflected light ray.

It should also be noted that the facets are not all necessarily the same shape and do not necessarily all have the same radial width.

As with the configuration of FIG. 3a, one potential advantage of using a faceted mirror as shown in FIG. 6 for the collector 30 is that as the number of facets of the faceted mirror increases and starts to approach the number of facets that would be used for the field facet mirror 42, e.g., about 400 facets, the faceted mirror serving as the collector 30 can be configured to perform the optical functions of both the collector mirror 30 and the field facet mirror 42, thus eliminating the need for a separate field facet mirror 42. This is potentially a significant advantage because each reflection off a mirror can reduce the amount of light by up to about 40%, so that eliminating a mirror can decrease the overall loss of light by the same amount. As used here, what is meant by saying that the faceted mirror can be configured is that the individual facets of the mirror can be shaped, sized, and oriented so that the mirror when used as the collector 30 can additionally perform the function of, and eliminate the need for, a separate field facet mirror 42.

Each facet comprises a substrate on which is placed a multiple layer reflective surface. The multiple layer reflective surface is optimized to reflect light at the wavelengths of interest, about 13.5 nm. The facet may also include a smoothing layer between the substrate and the multiple layer reflective surface and a capping layer on top of the multiple layer reflective surface in a manner known in the art. The gaps between the facets are shaped so that gas leaving the gap is directed to flow over the surface of the adjacent facet to ensure that EUV radiation from the plasma dissociates the diatomic hydrogen $H_2$ into hydrogen radicals H* which then reacts with the target material, here tin, on the surface to form $SnH_4$ (stannane). The gaps are preferably arranged and distributed so that there is a supply of fresh $H_2$ close to the front surface of each facet. The gaps are also preferably arranged and distributed so that every region is substantially the same distance away from an $H_2$ inlet defined by a gap.

The amount of overlap between adjacent facets is selected so that the gap between the facets is obscured from the perspective of the irradiation region 28. The amount of overlap is also selected to provide sufficient lateral extent for the gap so the gap effectively directs gas tangentially to the surface of the adjacent facet. It will also be understood by one of ordinary skill in the art the amount of overlap can vary from location to location, that is, the overlaps are not necessarily all the same in extent.

Thus, what has been disclosed is a reflective EUV optic 30 comprising a first facet that makes up a first portion of a reflective surface of the reflective EUV optic 30 a second facet 114 that makes up a second portion of the reflective surface of the reflective EUV optic 30. The first facet 112 is separated from the second facet 114 by a gap 130. The first facet 112 is separated from the second facet 114 and the first facet 112 overlaps the second facet 114 in a direction substantially tangential to the reflective surface where the first facet 110 overlaps the second facet 112.

In one disclosed embodiment, the reflective EUV optic 30 is preferably substantially rotationally symmetric about its central optical axis 120 and the first facet 112 and the second facet 114 are substantially annular. The arrangement also includes a plenum 140 in fluid communication with the gap 130. In another disclosed embodiment, the reflective EUV optic 30 is preferably an array of parallel strip-shaped facets.

Regarded another way, what has been disclosed is a reflective EUV optic 30 having a reflective surface, the reflective surface being composed of a plurality of facets 110-118 with adjacent facets being separated by respective gaps. At least one facet of the plurality of facets is separated from an adjacent facet in a direction parallel to the optical axis 120 of the EUV optic 30 and overlaps the adjacent facet in a direction substantially tangential to the reflective surface where the facet overlaps the adjacent facet. The plurality of annular facets preferably together makes up substantially the entire reflective surface of the reflective EUV optic 30.

As mentioned, the EUV optic 30 is placed in a chamber 26 during operation of the light source SO. The EUV optic 30 includes a plenum 140 in fluid communication with the gaps between the facets. The plenum 140 is in turn in fluid communication with a gas supply 150, thus placing the gas supply in fluid communication with the gaps. The pressure from the gas supply is established to be higher than a pressure within the chamber 26. In this way, the gaps function as gas inlets expelling gas into the chamber 26. The overall shape of these gaps will be annular or ring shaped in arrangements in which the facets themselves are annular or ring shaped. The general configuration of the gaps will be as inlets or passageways oriented generally parallel or tangential to the surface of the adjacent facet. In this fashion, the gaps or annular inlets are configured to direct the gas from the supply 150 in a direction tangential to the reflective surface adjacent the gap.

Also what has been disclosed is a method of generating EUV light which includes the steps of providing a reflective EUV optic 30 as described above and flowing gas from a gas supply 150 through the gaps in the reflective EUV optic 30 tangentially past a portion of the reflective surface of the reflective EUV optic 30 adjacent the gap.

Also what has been disclosed is a method of creating a gas sheath for a reflective EUV optic 30 which includes the steps of providing the EUV optic 30 as described above as having an ensemble of substantially circular inlets centered on the optical axis 120 of the EUV optic 30 and directed to cause gas flowing out of the inlets to flow across a reflective surface of the EUV optic 30.

The EUV optics 30 of FIGS. 5a and 5b as described above can be constructed by providing the support 100 and providing a plurality of substantially circular ring-shaped reflective elements such as facets 110-118 each having an interior diameter (the diameter of the circular hole in the middle of the ring) different from the interior diameter of other ring-shaped reflective elements and an exterior diameter (the overall diameter of the ring) different from the exterior diameter of other ring-shaped reflective elements.

The plurality of substantially circular ring-shaped reflective elements is mounted on the support in a "bull's-eye" arrangement so that the plurality of substantially circular ring-shaped reflective elements has a common center and a common focal point. The plurality of substantially circular ring-shaped reflective elements are also mounted on the support so that for any two adjacent circular ring-shaped reflective elements the exterior diameter of the circular ring-shaped reflective element mounted closer to the optical axis is greater than the interior diameter of the circular ring-shaped reflective element mounted farther from the optical axis. This is shown in FIG. 5a.

As stated, one potential advantage of an arrangement according to the present invention is that if a sufficient number of reflective facets are used to make up the reflective optical element, the facets can be configured and arranged such that the first optical element functions as a collector mirror and as a field facet mirror in the EUV optical system The exterior edge of the circular ring-shaped reflective element mounted closer to the optical axis overlaps in the direction of the optical axis the interior edge of the circular ring-shaped reflective element mounted farther from the optical axis. This creates the gap between the exterior edge of the circular ring-shaped reflective element mounted closer to the optical axis and the interior edge of the circular ring-shaped reflective element mounted farther from the optical axis through which gas may flow.

The EUV optic 30 of FIG. 6 as described above can be constructed by providing the support 100 and providing a plurality of substantially strip-shaped reflective elements such as facets 200-210. The plurality of substantially strip-shaped reflective elements is mounted on the support in a side-by-side arrangement so that the plurality of substantially strip-shaped reflective elements has a common focal point.

The above description includes examples of multiple embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is construed when employed as a transitional word in a claim. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

What is claimed is:

1. A reflective EUV optic comprising:
   a first facet comprising a first portion of a reflective surface of the reflective EUV optic; and
   a second facet comprising a second portion of the reflective surface of the reflective EUV optic, the first facet being separated from the second facet in a direction parallel to an optical axis of the reflective EUV optic and the first facet overlapping the second facet in a direction substantially tangential to the reflective surface to form a gap between the first facet and the second facet.

2. A reflective EUV optic as claimed in claim 1 wherein the first facet is separated from the second facet in a direction parallel to and the same as the optical axis of the reflective EUV optic.

3. A reflective EUV optic as claimed in claim 1 wherein the first facet is separated from the second facet in a direction parallel and opposed to the optical axis of the reflective EUV optic.

4. A reflective EUV optic as claimed in claim 1, the reflective EUV optic being substantially rotationally symmetric about a central optical axis, wherein the first facet and the second facet are substantially annular.

5. A reflective EUV optic as claimed in claim 4 wherein the first and second facets together make up substantially the entire reflective surface.

6. A reflective EUV optic as claimed in claim 1, further comprising a plenum in fluid communication with the gap.

7. A reflective EUV optic as claimed in claim 6, further comprising a gas supply in fluid communication with the plenum.

8. A reflective EUV optic as claimed in claim 7, wherein the EUV optic is located within a chamber, and wherein the gas supply in fluid communication with the plenum is at a pressure higher than a pressure in the chamber.

9. A reflective EUV optic having a reflective surface, the reflective surface being comprised of a plurality of facets with adjacent facets being separated by respective gaps wherein at least one facet of the plurality of facets is separated from an adjacent facet in a direction parallel to an optical axis of the EUV optic and overlaps the adjacent facet in a direction substantially tangential to the reflective surface where the facet overlaps the adjacent facet.

10. A reflective EUV optic as claimed in claim 9, wherein the reflective surface is substantially rotationally symmetric about a central optical axis, and wherein the facets are substantially annular.

11. A reflective EUV optic as claimed in claim 10, wherein the plurality of annular facets together make up substantially the entire reflective surface.

12. A reflective EUV optic as claimed in claim 9, further comprising a plenum in fluid communication with the gaps.

13. A reflective EUV optic as claimed in claim 12, further comprising a gas supply in fluid communication with the plenum.

14. A reflective EUV optic as claimed in claim 13, wherein the EUV optic is located within a chamber, and wherein the gas supply in fluid communication with the plenum is at a pressure higher than a pressure in the chamber.

15. A reflective EUV optic having a reflective surface, the reflective surface being comprised of a plurality of ring-shaped facets arranged concentrically about an optical axis of the EUV optic, with adjacent facets being separated by respective gaps.

16. A reflective EUV optic as claimed in claim 15, wherein the plurality of annular ring-shaped facets together make up substantially the entire reflective surface.

17. A reflective EUV optic as claimed in claim 15, further comprising a plenum in fluid communication with the gaps.

18. A reflective EUV optic as claimed in claim 17, further comprising a gas supply in fluid communication with the plenum.

19. A reflective EUV optic as claimed in claim 18, wherein the EUV optic is located within a chamber, and wherein the gas supply in fluid communication with the plenum is at a pressure higher than a pressure in the chamber.

20. A reflective EUV optic having a reflective surface, the reflective surface being comprised of a plurality of facets with adjacent facets being separated by respective gaps wherein at least one facet of the plurality of facets is separated from an adjacent facet in a direction parallel to an optical axis of the EUV optic.

21. A reflective EUV optic having a reflective surface, the reflective surface being comprised of a plurality of facets with adjacent facets being separated by respective gaps wherein at least one facet of the plurality of facets overlaps an adjacent facet in a direction substantially tangential to the reflective surface where the facet overlaps the adjacent facet.

* * * * *